(12) United States Patent
Kim et al.

(10) Patent No.: US 11,641,782 B2
(45) Date of Patent: May 2, 2023

(54) SPIN-ORBIT TORQUE-BASED SWITCHING DEVICE AND METHOD OF FABRICATING THE SAME

(71) Applicant: Korea University Research and Business Foundation, Seoul (KR)

(72) Inventors: Young Keun Kim, Seoul (KR); Gyu Won Kim, Seoul (KR)

(73) Assignee: Korea University Research and Business Foundation, Seoul (KR)

( * ) Notice: Subject to any disclaimer, the term of this patent is extended or adjusted under 35 U.S.C. 154(b) by 267 days.

(21) Appl. No.: 17/065,946

(22) Filed: Oct. 8, 2020

(65) Prior Publication Data

US 2021/0119117 A1   Apr. 22, 2021

(30) Foreign Application Priority Data

Oct. 16, 2019 (KR) .................. 10-2019-0128664
Jan. 31, 2020 (KR) .................. 10-2020-0011887

(51) Int. Cl.
| | | |
|---|---|---|
| *H01L 43/10* | (2006.01) | |
| *C22C 27/02* | (2006.01) | |
| *C22C 27/04* | (2006.01) | |
| *C23C 14/14* | (2006.01) | |
| *C23C 14/35* | (2006.01) | |

(Continued)

(52) U.S. Cl.
CPC .......... *H01L 43/10* (2013.01); *C22C 27/025* (2013.01); *C22C 27/04* (2013.01); *C23C 14/14* (2013.01); *C23C 14/352* (2013.01); *C23C 14/5806* (2013.01); *H01F 10/329* (2013.01); *H01F 10/3254* (2013.01); *H01F 10/3286* (2013.01);

(Continued)

(58) Field of Classification Search
CPC ......... H01L 43/10; H01L 43/04; H01L 43/06; H01L 43/14; C22C 27/025; C22C 27/04; C23C 14/14; C23C 14/352; C23C 14/5806; H01F 10/3254; H01F 10/3286; H01F 10/329; H01F 41/302
USPC ......................................................... 257/421
See application file for complete search history.

(56) References Cited

U.S. PATENT DOCUMENTS

2017/0141158 A1 *  5/2017  Daibou .............. G11C 11/1657
2017/0338021 A1   11/2017  Xiao et al.
(Continued)

FOREIGN PATENT DOCUMENTS

| JP | 2004-227621 A | 8/2004 |
|---|---|---|
| JP | 2017-59634 A | 3/2017 |

(Continued)

OTHER PUBLICATIONS

Wang, T. et al., Large spin Hall angle in vanadium film. Sci Rep 7, 1306 (2017). https://doi.org/10.1038/s41598-017-01112-9 (Year: 2017).*

(Continued)

*Primary Examiner* — Jami Valentine Miller
(74) *Attorney, Agent, or Firm* — NSIP Law

(57) ABSTRACT

The present disclosure relates to a spin-orbit torque-based switching device and a method of fabricating the same. The spin-orbit torque-based switching device of the present disclosure includes a spin torque generating layer provided with a tungsten-vanadium alloy thin film exhibiting perpendicular magnetic anisotropy (PMA) characteristics and a magnetization free layer formed on the spin torque generating layer.

9 Claims, 8 Drawing Sheets

(51) Int. Cl.
- *C23C 14/58* (2006.01)
- *H01F 10/32* (2006.01)
- *H01F 41/30* (2006.01)
- *H01L 43/04* (2006.01)
- *H01L 43/06* (2006.01)
- *H01L 43/14* (2006.01)

(52) U.S. Cl.
CPC ........... *H01F 41/302* (2013.01); *H01L 43/04* (2013.01); *H01L 43/06* (2013.01); *H01L 43/14* (2013.01)

(56) References Cited

U.S. PATENT DOCUMENTS

| | | | |
|---|---|---|---|
| 2019/0013460 A1* | 1/2019 | Ikegawa | H01F 10/3286 |
| 2019/0295615 A1 | 9/2019 | Fukuzawa et al. | |

FOREIGN PATENT DOCUMENTS

| | | |
|---|---|---|
| KR | 10-1457511 B1 | 11/2014 |
| KR | 10-2015-0018413 A | 2/2015 |
| KR | 10-2016-0134598 A | 11/2016 |
| KR | 10-1829452 B1 | 2/2018 |
| WO | WO 2017/208576 A1 | 12/2017 |
| WO | WO 2018/163618 A1 | 9/2018 |

OTHER PUBLICATIONS

Japanese Notice of Reasons for Refusal dated Sep. 10, 2021 in corresponding Japanese Patent Application No. 2020-174818. (10 pages in English and 10 pages in Japanese).

Korean Office Action dated Feb. 22, 2021 in counterpart Korean Patent Application No. 10-2020-0011887 (4 pages in Korean).

Zhu, Lijun et al., "Spin-orbit torques in heavy metal/ferromagnet bilayers with varying strength of interfacial spin-orbit coupling", *Physical review letters*, vol. 122, Issue 7, Feb. 22, 2019 (pp. 1-16).

Extended European Search Report dated Nov. 19, 2020 in counterpart European Patent Application No. 20180914.2 (11 pages in English).

* cited by examiner

【FIG. 1】
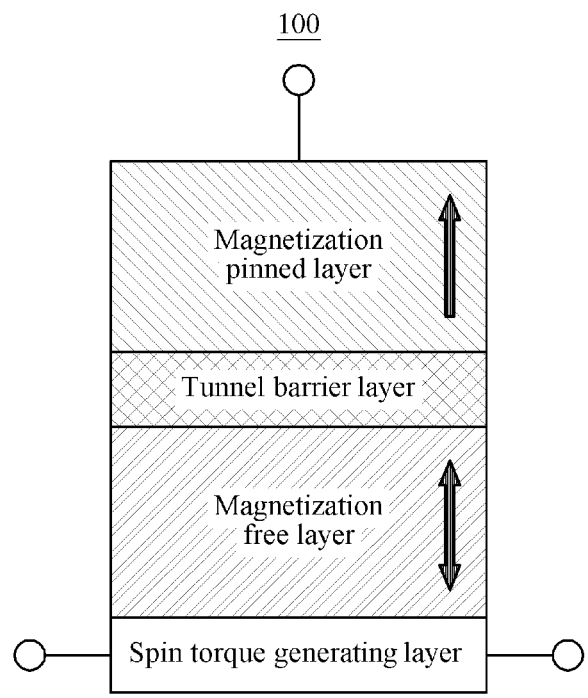
【FIG. 2】
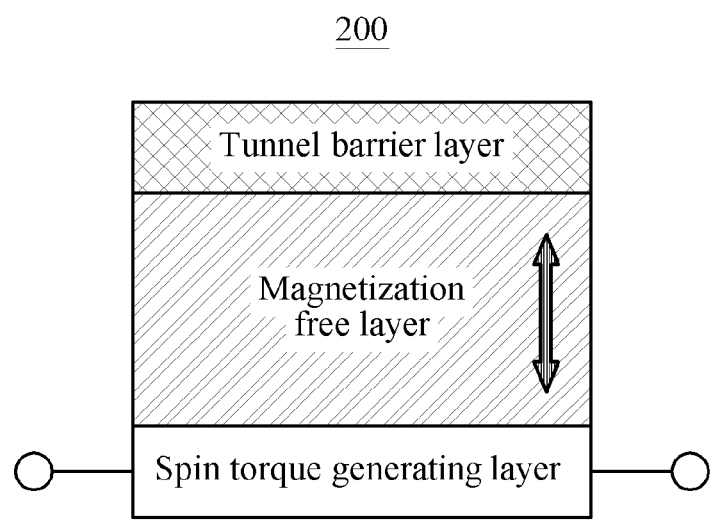

【FIG. 3】
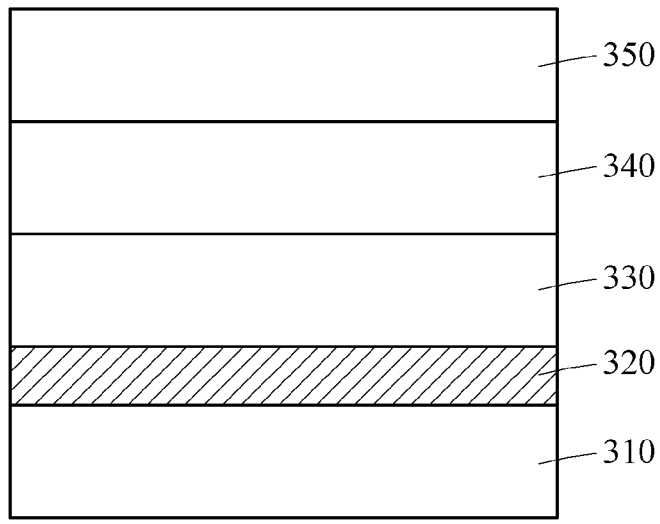
【FIG. 4A】
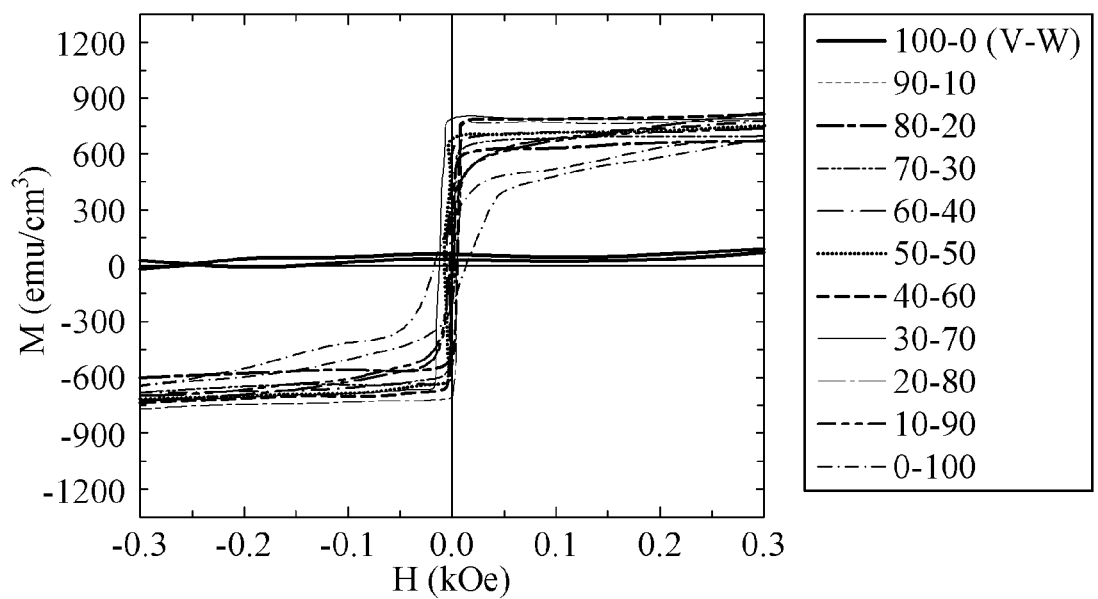

【FIG. 4B】
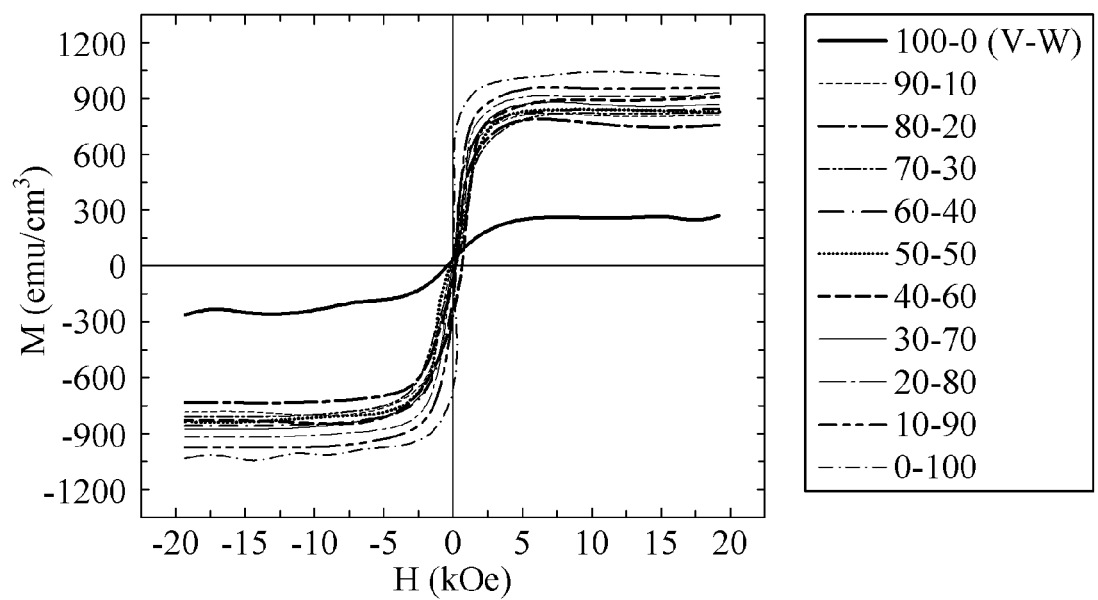
【FIG. 5A】
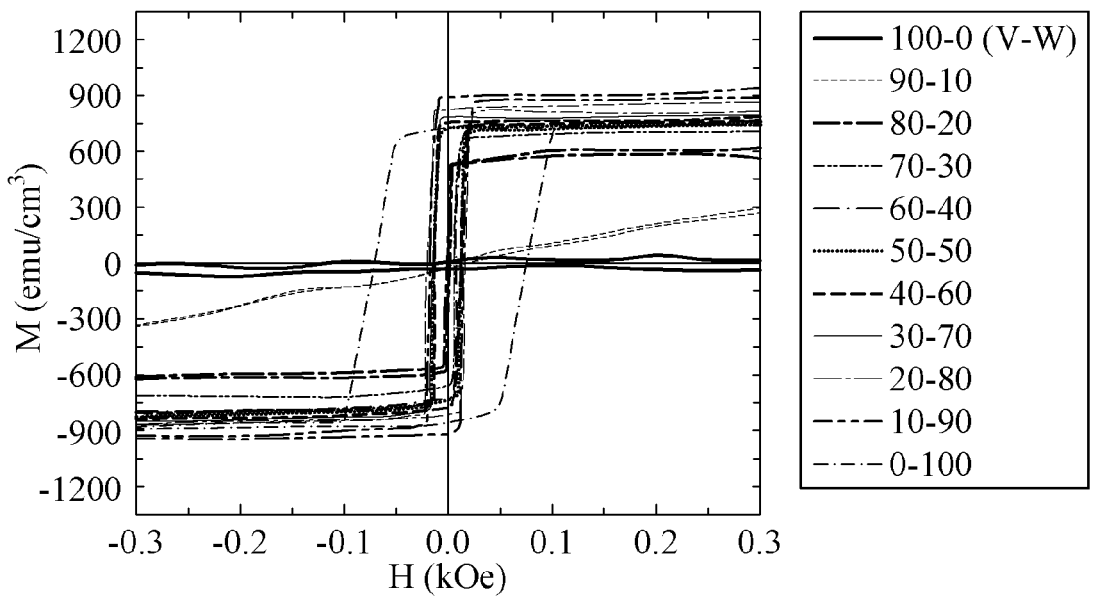

[FIG. 5B]
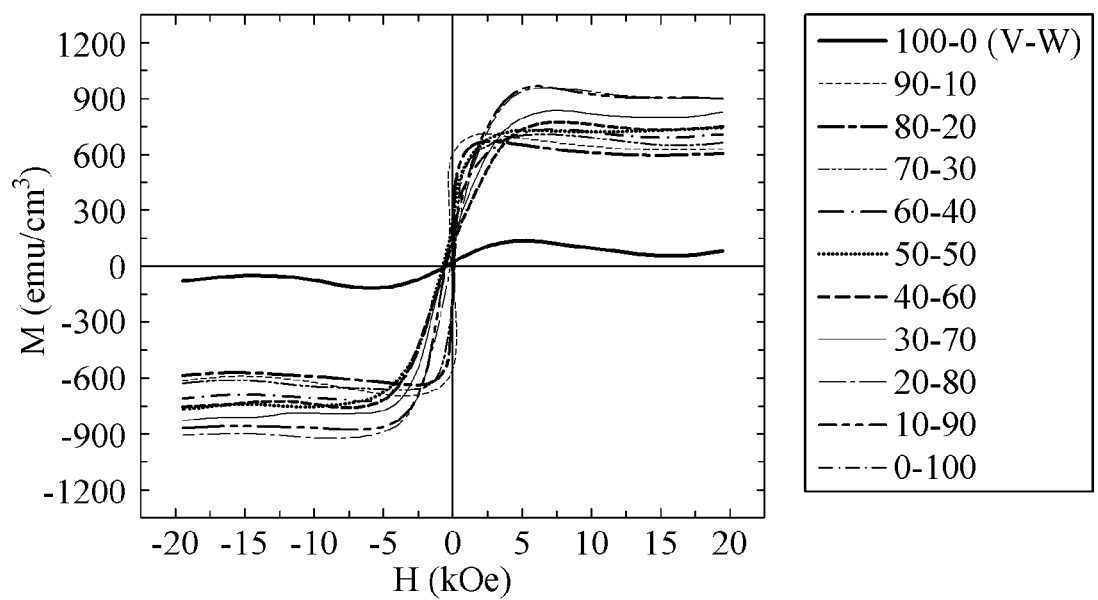
[FIG. 6A]
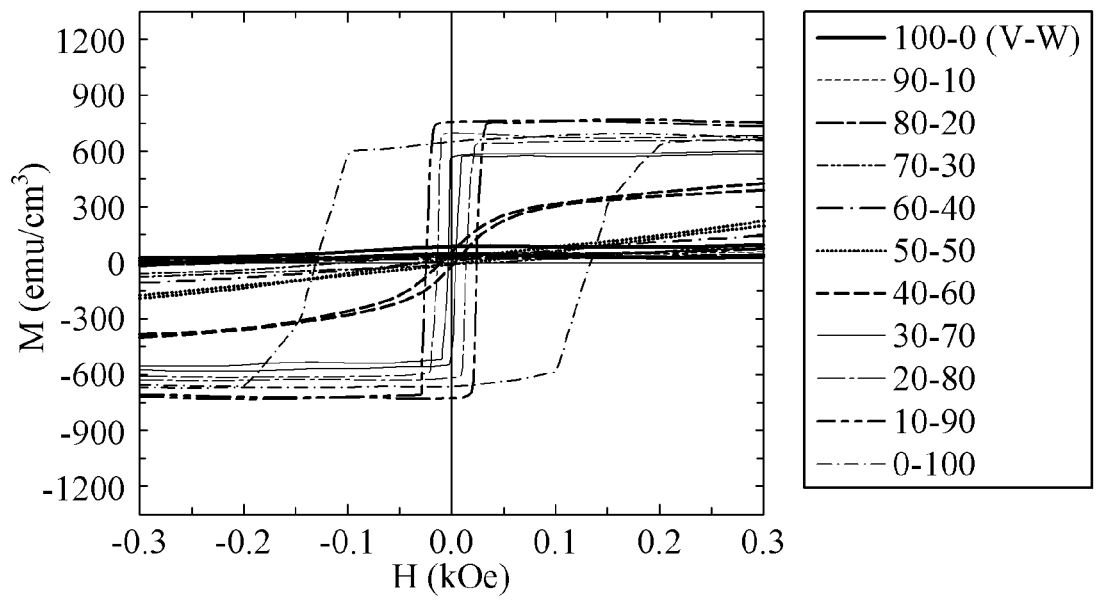

【FIG. 6B】
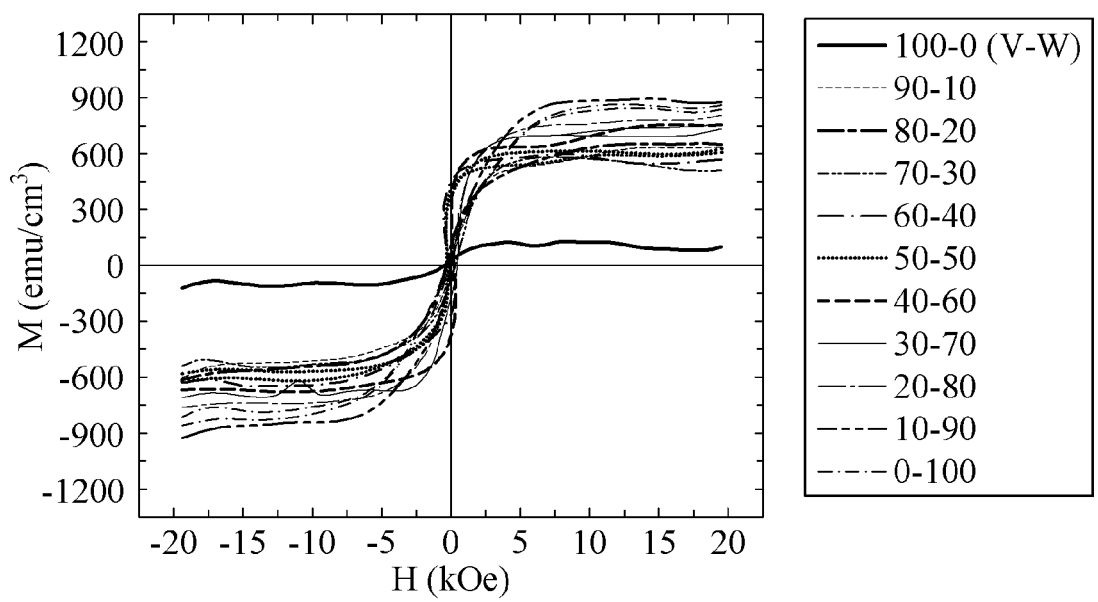
【FIG. 7A】
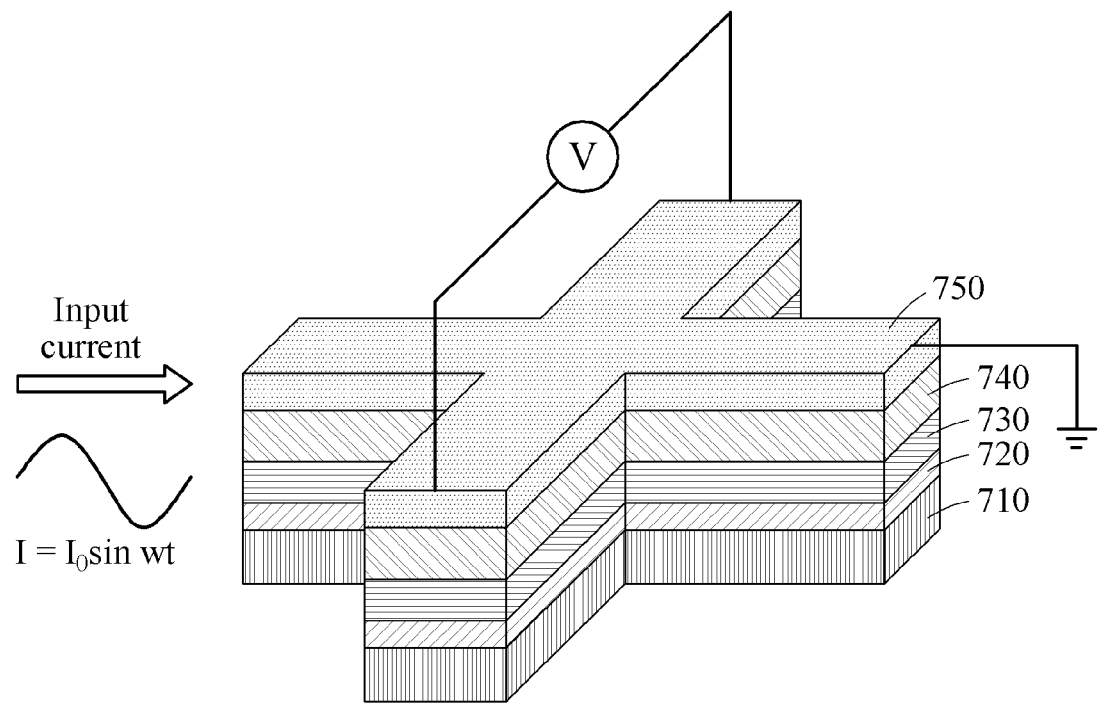

[FIG. 7B]
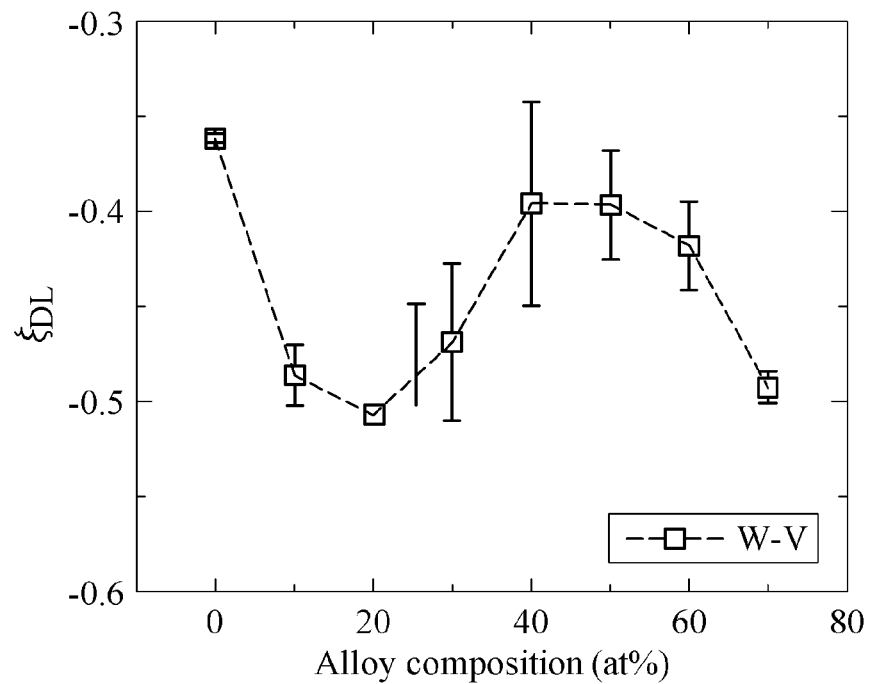
[FIG. 8A]
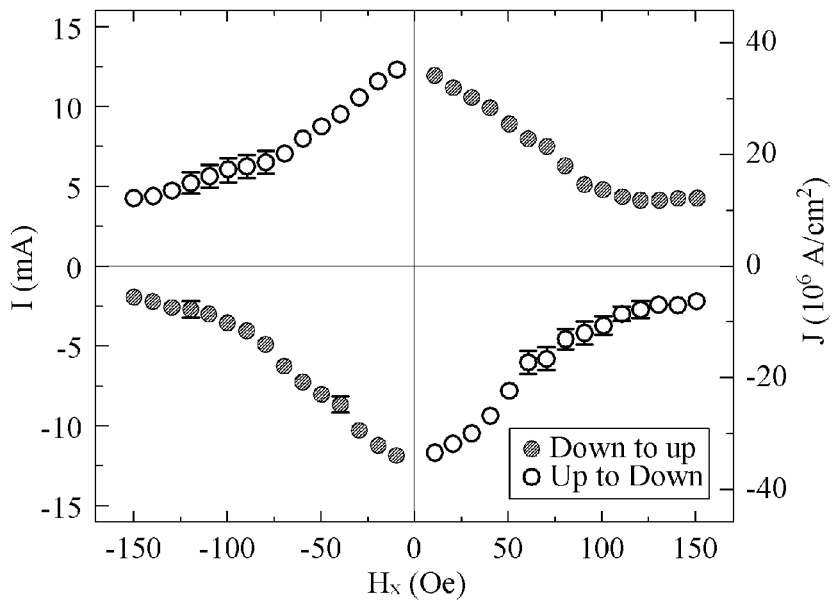

[FIG. 8B]
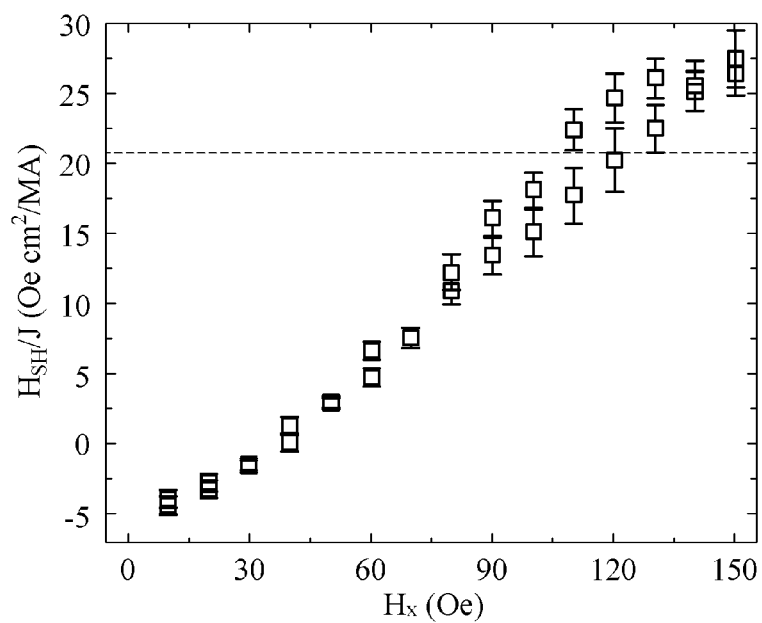

[FIG. 9]
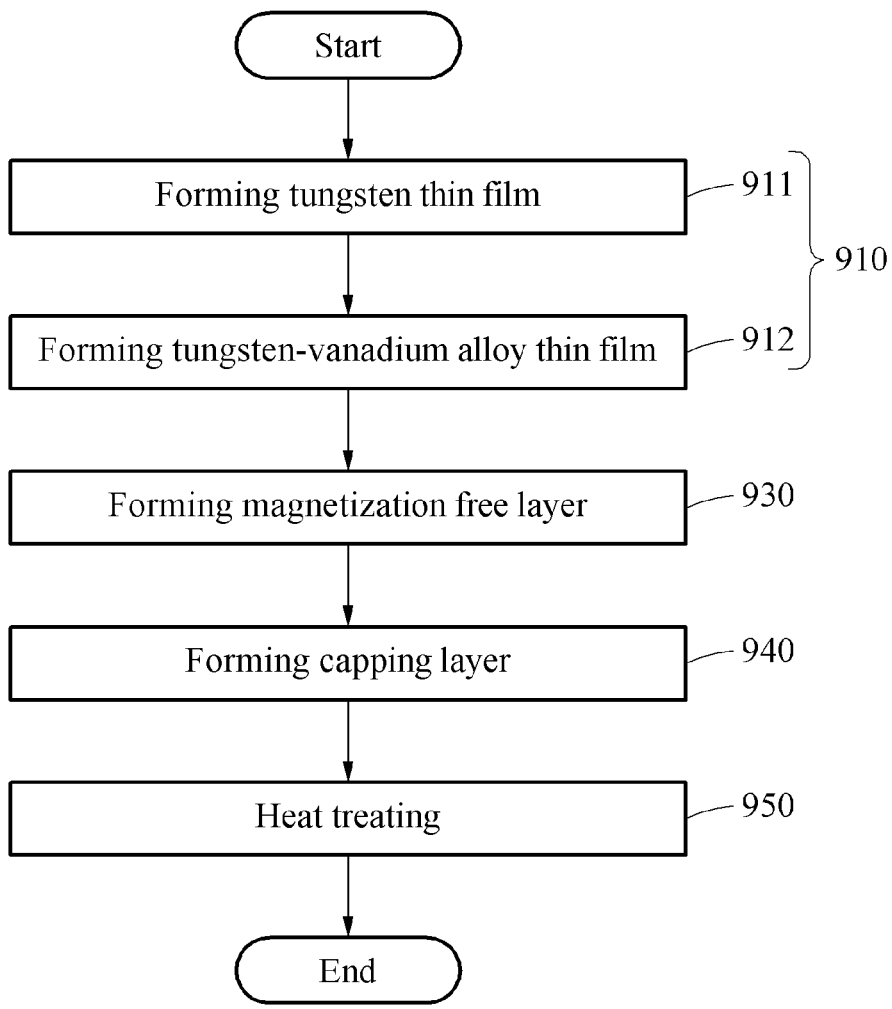

SPIN-ORBIT TORQUE-BASED SWITCHING DEVICE AND METHOD OF FABRICATING THE SAME

CROSS-REFERENCE TO RELATED APPLICATIONS

This application claims priority to Korean Patent Application No. 10-2019-0128664, filed on Oct. 16, 2019, and Korean Patent Application No. 10-2020-0011887, filed on Jan. 31, 2020, in the Korean Intellectual Property Office, the disclosures of each of which are incorporated herein by reference.

BACKGROUND OF THE DISCLOSURE

Field of the Disclosure

The present disclosure relates to a spin-orbit torque-based switching device and a method of fabricating the same, and more particularly, to a switching device capable of spin-orbit torque switching while maintaining perpendicular magnetic anisotropy.

Description of the Related Art

FIG. 1 illustrates a typical magnetic tunnel junction device. Referring to FIG. 1, a magnetic tunnel junction (MTJ) 100, which is a core element of a spin-orbit torque (SOT) switching-based MRAM, has a laminated structure in which a non-magnetic spin torque generating layer, a magnetization free layer, a tunnel barrier layer, and a magnetization pinned layer are laminated. The magnetic tunnel junction 100 stores information using a tunneling magneto-resistance (TMR) phenomenon in which an electric resistance value of tunneling current passing through an insulating layer is changed according to the relative magnetization directions of the magnetization free layer and the magnetization pinned layer.

To implement a high tunneling magneto-resistance ratio, high writing stability, low writing current, and high integration, the magnetic tunnel junction 100 must have perpendicular magnetic anisotropy (PMA) characteristics. Here, the perpendicular magnetic anisotropy means that the magnetization direction of a magnetic layer is perpendicular to the surface of the magnetic layer.

Recently, a spin-orbit torque phenomenon in which switching of a magnetization free layer is induced using a spin Hall effect or a Rashba effect that occurs when current flows in a parallel direction in the plane of a spin torque generating layer adjacent to the magnetization free layer was discovered. Technology using the spin-orbit torque phenomenon is receiving attention as a technology capable of writing information with high speed and low current consumption compared to a conventional spin-transfer torque (STT) writing method. In this case, it is essential to form a structure having a large spin Hall angle indicating a spin-orbit torque efficiency by diversifying the combination of materials constituting the spin torque generating layer.

Accordingly, according to the known technique, to improve a spin-orbit torque efficiency, a structure in which a heterogeneous additional layer is formed between the spin torque generating layer and the magnetization free layer in the magnetic tunnel junction 100 has been proposed. However, this structure has a problem in that loss occurs in terms of perpendicular magnetic anisotropy energy.

RELATED ART DOCUMENTS

Patent Documents

Korean Patent No. 10-1829452, "MAGNETIC MEMORY DEVICE"
Korean Patent No. 10-1457511, "SPIN HALL EFFECT MAGNETIC DEVICE, FABRICATION METHOD THEREOF, AND APPLICATION THEREOF"

SUMMARY OF THE DISCLOSURE

Therefore, the present disclosure has been made in view of the above problems, and it is an object of the present disclosure to provide a spin-orbit torque-based switching device and a method of fabricating the same. According to the present disclosure, by depositing a tungsten-vanadium alloy on tungsten, which is a additional layer, a spin-orbit torque efficiency may be improved without loss of perpendicular magnetic anisotropy energy.

It is another object of the present disclosure to provide a spin-orbit torque-based switching device including a tungsten-vanadium alloy formed to contact a magnetization free layer to function as a conductive layer for providing in-plane current and a method of fabricating the spin-orbit torque-based switching device.

It is yet another object of the present disclosure to provide a spin-orbit torque-based switching device and a method of fabricating the same. According to the present disclosure, the composition range and heat treatment conditions of a tungsten-vanadium alloy may be optimized to exhibit characteristics of perpendicular magnetic anisotropy.

In accordance with one aspect of the present disclosure, provided is a spin-orbit torque-based switching device including a spin torque generating layer provided with a tungsten-vanadium alloy thin film exhibiting perpendicular magnetic anisotropy (PMA) characteristics; and a magnetization free layer formed on the spin torque generating layer.

According to one aspect of the present disclosure, the spin torque generating layer may include a tungsten thin film and the tungsten-vanadium alloy thin film formed between the tungsten thin film and the magnetization free layer.

According to one aspect of the present disclosure, the spin-orbit torque-based switching device may be formed through heat treatment within a temperature range of 250° C. to 400° C.

According to one aspect of the present disclosure, the tungsten-vanadium alloy thin film may be formed in a predetermined composition ratio according to the heat treatment temperature.

According to one aspect of the present disclosure, when the heat treatment temperature is 250° C., a composition ratio of vanadium (x) in the tungsten-vanadium alloy thin film may be 20 at %$\leq$x$\leq$90 at %; when the heat treatment temperature is 300° C., a composition ratio of vanadium (x) in the tungsten-vanadium alloy thin film may be 0 at %<x$\leq$70 at %; and when the heat treatment temperature is 400° C., a composition ratio of vanadium (x) in the tungsten-vanadium alloy thin film may be 0 at %<x$\leq$30 at %. In this case, "x" may represent a real number.

In accordance with another aspect of the present disclosure, provided is a method of fabricating a spin-orbit torque-based switching device, the method including forming a spin torque generating layer provided with a tungsten-vanadium alloy thin film exhibiting perpendicular magnetic anisotropy (PMA) characteristics; and forming a magnetization free layer on the spin torque generating layer.

According to one aspect of the present disclosure, the forming of the spin torque generating layer may further include forming a tungsten thin film; and forming the tungsten-vanadium alloy thin film on the tungsten thin film.

According to one aspect of the present disclosure, in the forming of the alloy thin film, the tungsten-vanadium alloy thin film may be formed through a co-deposition method using a tungsten target and a vanadium target.

According to one aspect of the present disclosure, the method may further include performing heat treatment within a temperature range of 250° C. to 400° C.

According to one aspect of the present disclosure, in the forming of the alloy thin film, the tungsten-vanadium alloy thin film may be formed in a predetermined composition ratio according to the heat treatment temperature.

According to one aspect of the present disclosure, in the forming of the alloy thin film, when the heat treatment temperature is 250° C., the tungsten-vanadium alloy thin film having a composition ratio of vanadium (x) of 20 at %≤x≤90 at % may be formed; when the heat treatment temperature is 300° C., the tungsten-vanadium alloy thin film having a composition ratio of vanadium (x) of 0 at %<x≤70 at % may be formed; and when the heat treatment temperature is 400° C., the tungsten-vanadium alloy thin film having a composition ratio of vanadium (x) of 0 at %<x≤30 at % may be formed. In this case, "x" may represent a real number.

BRIEF DESCRIPTION OF THE DRAWINGS

The above and other objects, features and other advantages of the present disclosure will be more clearly understood from the following detailed description taken in conjunction with the accompanying drawings, in which:

FIG. 1 illustrates a typical magnetic tunnel junction device;

FIG. 2 illustrates a spin-orbit torque-based switching device according to one embodiment;

FIG. 3 is a drawing for explaining an example of implementation of a spin-orbit torque-based switching device according to one embodiment;

FIGS. 4A and 4B includes graphs showing the characteristics of perpendicular magnetic anisotropy of a spin-orbit torque-based switching device according to one embodiment heat-treated at 250° C.;

FIGS. 5A and 5B includes graphs showing the characteristics of perpendicular magnetic anisotropy of a spin-orbit torque-based switching device according to one embodiment heat-treated at 300° C.;

FIGS. 6A and 6B includes graphs showing the characteristics of perpendicular magnetic anisotropy of a spin-orbit torque-based switching device according to one embodiment heat-treated at 400° C.;

FIGS. 7A and 7B includes drawings for explaining the spin-orbit torque efficiency of a spin-orbit torque-based switching device according to one embodiment heat-treated at 300° C.;

FIGS. 8A and 8B includes graphs showing the switching current and spin-orbit torque effective magnetic field characteristics of a spin-orbit torque-based switching device according to one embodiment; and FIG. 9 is a flowchart for explaining a method of fabricating a spin-orbit torque-based switching device according to one embodiment.

DETAILED DESCRIPTION OF THE DISCLOSURE

The embodiments will be described in detail herein with reference to the drawings.

It should be understood that the present disclosure is not limited to the embodiments according to the concept of the present disclosure, but includes changes, equivalents, or alternatives falling within the spirit and scope of the present disclosure.

In the following description of the present disclosure, a detailed description of known functions and configurations incorporated herein will be omitted when it may make the subject matter of the present disclosure unclear.

The terms used in the specification are defined in consideration of functions used in the present disclosure, and can be changed according to the intent or conventionally used methods of clients, operators, and users. Accordingly, definitions of the terms should be understood on the basis of the entire description of the present specification.

In description of the drawings, like reference numerals may be used for similar elements.

The singular expressions in the present specification may encompass plural expressions unless clearly specified otherwise in context.

In this specification, expressions such as "A or B" and "at least one of A and/or B" may include all possible combinations of the items listed together.

Expressions such as "first" and "second" may be used to qualify the elements irrespective of order or importance, and are used to distinguish one element from another and do not limit the elements.

It will be understood that when an element (e.g., first) is referred to as being "connected to" or "coupled to" another element (e.g., second), it may be directly connected or coupled to the other element or an intervening element (e.g., third) may be present.

As used herein, "configured to" may be used interchangeably with, for example, "suitable for", "ability to", "changed to", "made to", "capable of", or "designed to" in terms of hardware or software.

In some situations, the expression "device configured to" may mean that the device "may do~" with other devices or components.

For example, in the sentence "processor configured to perform A, B, and C", the processor may refer to a general purpose processor (e.g., CPU or application processor) capable of performing corresponding operation by running a dedicated processor (e.g., embedded processor) for performing the corresponding operation, or one or more software programs stored in a memory device.

In addition, the expression "or" means "inclusive or" rather than "exclusive or".

That is, unless otherwise mentioned or clearly inferred from context, the expression "x uses a or b" means any one of natural inclusive permutations.

In the above-described specific embodiments, elements included in the invention are expressed singular or plural in accordance with the specific embodiments shown.

It should be understood, however, that the singular or plural representations are to be chosen as appropriate to the situation presented for the purpose of description and that the above-described embodiments are not limited to the singular or plural constituent elements. The constituent elements expressed in plural may be composed of a single number, and constituent elements expressed in singular form may be composed of a plurality of elements.

In addition, the present disclosure has been described with reference to exemplary embodiments, but it should be understood that various modifications may be made without departing from the scope of the present disclosure.

Therefore, the scope of the present disclosure should not be limited by the embodiments, but should be determined by the following claims and equivalents to the following claims.

FIG. 2 illustrates a spin-orbit torque-based switching device according to one embodiment.

Referring to FIG. 2, a spin-orbit torque-based switching device 200 according to one embodiment may include a spin torque generating layer provided with a tungsten-vanadium alloy thin film exhibiting perpendicular magnetic anisotropy (PMA) characteristics, a magnetization free layer formed on the spin torque generating layer, and a tunnel barrier layer formed on the magnetization free layer.

According to one aspect of the present disclosure, the spin-orbit torque-based switching device 200 may be formed by laminating the spin torque generating layer, the magnetization free layer, and the tunnel barrier layer in a sequential order and performing heat treatment at a predetermined temperature.

In addition, the composition range of the tungsten-vanadium alloy thin film may be optimized according to heat treatment temperature. Through the tungsten-vanadium alloy thin film formed based on the optimized composition range, the spin-orbit torque-based switching device 200 may increase a spin-orbit torque efficiency without loss of perpendicular magnetic anisotropy energy.

The spin-orbit torque-based switching device 200 according to one embodiment will be described in more detail with reference to FIG. 3.

FIG. 3 is a drawing for explaining an example of implementation of a spin-orbit torque-based switching device according to one embodiment.

Referring to FIG. 3, a spin-orbit torque-based switching device 300 according to one embodiment may be formed in a laminated structure in which a spin torque generating layer including a tungsten thin film 310 and a tungsten-vanadium alloy thin film 320 and a magnetization free layer 330 are laminated, and may further include a tunnel barrier layer 340 formed on the magnetization free layer 330 and a capping layer 350.

For example, the magnetization free layer 330 may include at least one selected from the group consisting of cobalt (Co), iron (Fe), boron (B), palladium (Pd), nickel (Ni), manganese (Mn), and alloys thereof.

In addition, the tunnel barrier layer 340 may include at least one of magnesium oxide (MgO), aluminum oxide ($Al_2O_3$), hafnium oxide ($HfO_2$), titanium dioxide ($TiO_2$), yttrium oxide ($Y_2O_3$), and ytterbium oxide ($Yb_2O_3$).

Preferably, the magnetization free layer 330 may be formed of a cobalt-iron-boron alloy (CoFeB) thin film, and the tunnel barrier layer 340 may be formed of a magnesium oxide (MgO) thin film. In addition, the capping layer 350 may be formed of a tantalum (Ta) thin film.

According to one aspect of the present disclosure, the tungsten thin film 310 may be formed on an amorphous natural oxide layer formed on a substrate. For example, the substrate may be a silicon (Si) substrate, and the natural oxide layer may be a silicon oxide ($SiO_2$) film.

According to one aspect of the present disclosure, in the spin-orbit torque-based switching device 300, when a metal layer is laminated, a direct current (dc) magnetron sputtering method is used. When an insulator is laminated, an alternating current (ac) magnetron sputtering method is used. These layers may be formed through deposition performed under a base pressure of $5 \times 10^{-9}$ Torr or less and an argon (Ar) atmosphere.

In addition, the thickness of each layer of the spin-orbit torque-based switching device 300 may be controlled by adjusting deposition time and sputtering power.

For example, by adjusting deposition time and sputtering power, the tungsten thin film 310 may be formed to a thickness of 4 nm, the tungsten-vanadium alloy thin film 320 may be formed to a thickness of 2 nm, the magnetization free layer 330 may be formed to a thickness of 0.9 nm, the tunnel barrier layer 340 may be formed to a thickness of 1 nm, and the capping layer 350 may be formed to a thickness of 2 nm.

In addition, the spin-orbit torque-based switching device 300 may be formed through heat treatment within a temperature range of 250° C. to 400° C. For example, heat treatment may be performed for about 1 hour under an environment in which a base pressure of $10^{-6}$ Torr band and an external magnetic field of 6 kOe are applied.

That is, the spin-orbit torque-based switching device 300 may be formed by laminating the tungsten thin film 310, the tungsten-vanadium alloy thin film 320, the magnetization free layer 330, the tunnel barrier layer 340, and the capping layer 350 and then performing heat treatment within a temperature range of 250° C. to 400° C.

According to one aspect of the present disclosure, the tungsten-vanadium alloy thin film 320 may be formed in a predetermined composition ratio according to heat treatment temperature.

More specifically, when heat treatment temperature is 250° C., the composition ratio of vanadium (x, wherein "x" represents a real number) in the tungsten-vanadium alloy thin film 320 may be 20 at %≤x≤90 at %.

In addition, when heat treatment temperature is 300° C., the composition ratio of vanadium (x) in the tungsten-vanadium alloy thin film 320 may be 0 at %<x≤70 at %.

In addition, when heat treatment temperature is 400° C., the composition ratio of vanadium (x) in the tungsten-vanadium alloy thin film 320 may be 0 at %<x≤30 at %.

FIGS. 4A and 4B includes graphs showing the characteristics of perpendicular magnetic anisotropy of a spin-orbit torque-based switching device according to one embodiment heat-treated at 250° C.

Referring to FIGS. 4A and 4B, a specimen of a tungsten-vanadium alloy thin film according to one embodiment, in which the composition ratio (at %) of vanadium (V) and tungsten (W) was adjusted, was heat-treated at 250° C. for 1 hour, and a magnetic hysteresis curve corresponding to the out-of-plane direction of the heat-treated specimen was measured. The measured results are shown in FIG. 4A. In addition, a magnetic hysteresis curve corresponding to the in-plane direction of the heat-treated specimen was measured, and the measured results are shown in FIG. 4B. In this case, magnetic hysteresis curves may be measured using a vibrating sample magnetometer (VSM).

Referring to FIGS. 4A and 4B, it can be confirmed that, in a spin-orbit torque-based switching device (W: 4 nm/W–V: 2 nm/CoFeB: 0.9 nm/MgO: 1 nm/Ta: 2 nm) heat-treated at 250° C., when a vanadium (V) composition in a tungsten-vanadium (W–V) alloy thin film is within a range of 20 at % to 90 at %, the thin film exhibits perpendicular magnetic anisotropy.

FIGS. 5A and 5B includes graphs showing the characteristics of perpendicular magnetic anisotropy of a spin-orbit torque-based switching device according to one embodiment heat-treated at 300° C.

Referring to FIGS. 5A and 5B, a specimen of a tungsten-vanadium alloy thin film according to one embodiment, in which the composition ratio (at %) of vanadium (V) and tungsten (W) was adjusted, was heat-treated at 300° C. for 1 hour, and a magnetic hysteresis curve corresponding to the out-of-plane direction of the heat-treated specimen was measured. The measured results are shown in FIG. 5A. In addition, a magnetic hysteresis curve corresponding to the in-plane direction of the heat-treated specimen was measured, and the measured results are shown in FIG. 5B.

Referring to FIGS. 5A and 5B, it can be confirmed that, in a spin-orbit torque-based switching device (W: 4 nm/W–V: 2 nm/CoFeB: 0.9 nm/MgO: 1 nm/Ta: 2 nm) heat-treated at 300° C., when a vanadium (V) composition in a tungsten-vanadium (W–V) alloy thin film is within a range of 0 at % to 70 at %, the thin film exhibits perpendicular magnetic anisotropy.

FIGS. 6A and 6B includes graphs showing the characteristics of perpendicular magnetic anisotropy of a spin-orbit torque-based switching device according to one embodiment heat-treated at 400° C.

Referring to FIGS. 6A and 6B, a specimen of a tungsten-vanadium alloy thin film according to one embodiment, in which the composition ratio (at %) of vanadium (V) and tungsten (W) was adjusted, was heat-treated at 400° C. for 1 hour, and a magnetic hysteresis curve corresponding to the out-of-plane direction of the heat-treated specimen was measured. The measured results are shown in FIG. 6A. In addition, a magnetic hysteresis curve corresponding to the in-plane direction of the heat-treated specimen was measured, and the measured results are shown in FIG. 6B.

Referring to FIGS. 6A and 6B, it can be confirmed that, in a spin-orbit torque-based switching device (W: 4 nm/W–V: 2 nm/CoFeB: 0.9 nm/MgO: 1 nm/Ta: 2 nm) heat-treated at 400° C., when a vanadium (V) composition in a tungsten-vanadium (W–V) alloy thin film is within a range of 0 at % to 30 at %, the thin film exhibits perpendicular magnetic anisotropy.

FIGS. 7A and 7B includes drawings for explaining the spin-orbit torque efficiency of a spin-orbit torque-based switching device according to one embodiment heat-treated at 300° C.

Referring to FIG. 7A shows an example of forming a spin-orbit torque-based switching device according to one embodiment in a cross shape to measure spin-orbit torque efficiency, and FIG. 7B shows the measured result of the spin Hall angle of the switching device having a cross shape shown in FIG. 7A. In this case, the spin Hall angle may be measured through harmonics measurement.

Referring to FIG. 7A, to measure a spin Hall angle, the spin-orbit torque-based switching device in which a tungsten thin film 710, a tungsten-vanadium alloy thin film 720, a magnetization free layer 730, a tunnel barrier layer 740, and a capping layer 750 are laminated may be formed in a cross shape.

Referring to FIG. 7B, it can be confirmed that, in the spin-orbit torque-based switching device according to one embodiment, when a vanadium composition in the tungsten-vanadium alloy thin film 720 is within a range of 20 at % to 70 at %, the spin-orbit torque-based switching device exhibits a spin Hall angle of 0.50, showing an increase of about 40% compared to the spin Hall angle (0.35) of a conventional device only using the tungsten thin film 710 of a single layer without the tungsten-vanadium alloy thin film 720.

That is, it can be confirmed that, compared to a conventional device, the spin-orbit torque efficiency of the spin-orbit torque-based switching device according to one embodiment is increased by about 40%.

FIGS. 8A and 8B includes graphs showing the switching current and spin-orbit torque effective magnetic field characteristics of a spin-orbit torque-based switching device according to one embodiment.

Referring to FIGS. 8A and 8B, in the spin-orbit torque-based switching device according to one embodiment including a tungsten-vanadium alloy thin film containing vanadium in a content of 20 at %, switching current (or current density) depending on changes in the magnitude of an external magnetic field ($H_{ext}$) was measured, and the results are shown in FIG. 8A. That is, FIG. 8A shows switching measurement results using a four-point probe.

In addition, based on the switching measurement of the spin-orbit torque-based switching device according to one embodiment including a tungsten-vanadium alloy thin film containing vanadium in a content of 20 at %, a spin-orbit torque (SOT) effective magnetic field was calculated, and the results are shown in FIG. 8B. In FIG. 8B, the dotted line represents the magnitude of a spin-orbit torque effective magnetic field calculated through harmonics measurement.

Referring to FIG. 8A, in the spin-orbit torque-based switching device according to one embodiment, as the magnitude of an external magnetic field increases from 10 Oe to 150 Oe, the value of switching current (or current density) required for reversing magnetization decreases. In addition, spin-orbit torque switching is observed under all magnitudes of applied external magnetic fields.

In addition, it can be confirmed that, when the magnitude of an external magnetic field is ±120 Oe or more, the value of current (density) required for switching is saturated, showing an average switching current (density) value of 3.52 mA ($1.02 \times 10^7$ A/cm$^2$).

Referring to FIG. 8B, it can be confirmed that, as an external magnetic field applied to the spin-orbit torque-based switching device according to one embodiment increases, switching current decreases, and thus a spin Hall angle increases. In addition, when an external magnetic field is ±120 Oe or more, the value of current is saturated, showing a level similar to that measured by harmonics measurement (the dotted line shown in FIG. 8B).

That is, as a result of measuring a spin Hall angle, based on switching measurement, for a specimen containing vanadium in a content of 20 at %, which exhibits maximum efficiency through harmonics measurement as described in FIG. 7B, as in harmonics measurement, an efficiency of 50% (a spin Hall angle of 0.5) is exhibited.

FIG. 9 is a flowchart for explaining a method of fabricating a spin-orbit torque-based switching device according to one embodiment.

That is, FIG. 9 is a flowchart for explaining a method of fabricating the spin-orbit torque-based switching device according to one embodiment described in FIGS. 1 to 8B. In describing FIG. 9, repeated description of FIGS. 1 to 8B will be omitted.

Referring to FIG. 9, in the method of fabricating a switching device according to one embodiment, when a metal layer is laminated, a direct current (dc) magnetron sputtering method is used. When an insulator is laminated, an alternating current (ac) magnetron sputtering method is used. The switching device may be formed through deposition performed under a base pressure of $5 \times 10^{-9}$ Torr or less and an argon (Ar) atmosphere.

In addition, in the method of fabricating a switching device according to one embodiment, the thickness of each layer of the switching device may be controlled by adjusting deposition time and sputtering power.

For example, in the method of fabricating a switching device according to one embodiment, by adjusting deposition time and sputtering power, a tungsten thin film may be formed to a thickness of 4 nm, a tungsten-vanadium alloy thin film may be formed to a thickness of 2 nm, a magnetization free layer may be formed to a thickness of 0.9 nm, a tunnel barrier layer may be formed to a thickness of 1 nm, and a capping layer may be formed to a thickness of 2 nm.

Specifically, according to the method of fabricating a switching device according to one embodiment, in step 910, a spin torque generating layer provided with a tungsten-vanadium alloy thin film exhibiting perpendicular magnetic anisotropy (PMA) characteristics may be formed.

Specifically, according to the method of fabricating a switching device according to one embodiment, in step 911, a tungsten thin film may be formed.

Next, according to the method of fabricating a switching device according to one embodiment, in step 912, a tungsten-vanadium alloy thin film may be formed on the tungsten thin film.

According to one aspect of the present disclosure, according to the method of fabricating a switching device according to one embodiment, in step 912, a tungsten-vanadium alloy thin film may be formed through a co-deposition method using a tungsten target and a vanadium target.

Next, according to the method of fabricating a switching device according to one embodiment, in step 930, a magnetization free layer may be formed on the spin torque generating layer.

For example, the magnetization free layer may include at least one selected from the group consisting of cobalt (Co), iron (Fe), boron (B), palladium (Pd), nickel (Ni), manganese (Mn), and alloys thereof.

Preferably, the magnetization free layer may be formed of a cobalt-iron-boron alloy (CoFeB) thin film, and the composition of a sputtering target for forming the cobalt-iron-boron alloy thin film may be $Co_{40}Fe_{40}B_{20}$(at %).

Next, according to the method of fabricating a switching device according to one embodiment, in step 940, a tunnel barrier layer and a capping layer may be laminated in a sequential order on the magnetization free layer.

For example, the tunnel barrier layer may include at least one of magnesium oxide (MgO), aluminum oxide ($Al_2O_3$), hafnium oxide ($HfO_2$), titanium dioxide ($TiO_2$), yttrium oxide ($Y_2O_3$), and ytterbium oxide ($Yb_2O_3$).

Preferably, the tunnel barrier layer may be formed of a magnesium oxide (MgO) thin film, and the capping layer may be formed of a tantalum (Ta) thin film.

Next, according to the method of fabricating a switching device according to one embodiment, in step 950, heat treatment may be performed within a temperature range of 250° C. to 400° C.

According to one aspect of the present disclosure, according to the method of fabricating a switching device according to one embodiment, in step 912, a tungsten-vanadium alloy thin film may be formed in a predetermined composition ratio according to heat treatment temperature.

More specifically, according to the method of fabricating a switching device according to one embodiment, in step 912, when heat treatment temperature is 250° C., a tungsten-vanadium alloy thin film having a composition ratio of vanadium (x, wherein "x" represents a real number) of 20 at %≤x≤90 at % may be formed.

In addition, according to the method of fabricating a switching device according to one embodiment, in step 912, when heat treatment temperature is 300° C., a tungsten-vanadium alloy thin film having a composition ratio of vanadium (x) of 0 at %<x≤70 at % may be formed.

In addition, according to the method of fabricating a switching device according to one embodiment, in step 912, when heat treatment temperature is 400° C., a tungsten-vanadium alloy thin film having a composition ratio of vanadium (x) of 0 at %<x≤30 at % may be formed.

Accordingly, according to the present disclosure, by depositing a tungsten-vanadium alloy on tungsten, which is a additional layer, a spin-orbit torque efficiency may be improved without loss of perpendicular magnetic anisotropy energy.

In addition, according to the present disclosure, the tungsten-vanadium alloy may be formed to contact a magnetization free layer to function as a conductive layer for providing in-plane current.

In addition, the composition range and heat treatment conditions of the tungsten-vanadium alloy may be optimized to exhibit characteristics of perpendicular magnetic anisotropy.

According to one embodiment, the switching device of the present disclosure can improve a spin-orbit torque efficiency without loss of perpendicular magnetic anisotropy energy by depositing a tungsten-vanadium alloy on tungsten, which is a additional layer.

According to one embodiment, in the switching device of the present disclosure, a tungsten-vanadium alloy can be formed to contact a magnetization free layer to function as a conductive layer for providing in-plane current. In addition, according to the present disclosure, the composition range and heat treatment conditions of the tungsten-vanadium alloy can be optimized to exhibit characteristics of perpendicular magnetic anisotropy.

Although the present disclosure has been described with reference to limited embodiments and drawings, it should be understood by those skilled in the art that various changes and modifications may be made therein. For example, the described techniques may be performed in a different order than the described methods, and/or components of the described systems, structures, devices, circuits, etc., may be combined in a manner that is different from the described method, or appropriate results may be achieved even if replaced by other components or equivalents.

Therefore, other embodiments, other examples, and equivalents to the claims are within the scope of the following claims.

What is claimed is:

1. A spin-orbit torque-based switching device, comprising:
    a spin torque generating layer provided with a tungsten-vanadium alloy thin film; and
    a magnetization free layer formed on the spin torque generating layer,
    wherein the spin torque generating layer comprises a tungsten thin film and the tungsten-vanadium alloy thin film formed between the tungsten thin film and the magnetization free layer.

2. The spin-orbit torque-based switching device according to claim 1, wherein the spin-orbit torque-based switching device is formed through heat treatment within a temperature range of 250° C. to 400° C.

3. The spin-orbit torque-based switching device according to claim 2, wherein the tungsten-vanadium alloy thin film is formed in a predetermined composition ratio according to the heat treatment temperature.

4. The spin-orbit torque-based switching device according to claim 3, wherein, when the heat treatment temperature is 250° C., a composition ratio of vanadium (x) in the tungsten-vanadium alloy thin film is 20 at %≤x≤90 at %;

when the heat treatment temperature is 300° C., a composition ratio of vanadium (x) in the tungsten-vanadium alloy thin film is 0 at %<x≤70 at %; and when the heat treatment temperature is 400° C., a composition ratio of vanadium (x) in the tungsten-vanadium alloy thin film is 0 at %<x≤30 at %, wherein "x" represents a real number.

5. A method of fabricating a spin-orbit torque-based switching device, comprising:

forming a spin torque generating layer provided with a tungsten-vanadium alloy thin film; and forming a magnetization free layer on the spin torque generating layer, wherein the forming of the spin torque generating layer further comprises:

forming a tungsten thin film; and forming the tungsten-vanadium alloy thin film on the tungsten thin film.

6. The method according to claim 5, wherein, in the forming of the alloy thin film, the tungsten-vanadium alloy thin film is formed through a co-deposition method using a tungsten target and a vanadium target.

7. The method according to claim 6, further comprising performing heat treatment within a temperature range of 250° C. to 400° C.

8. The method according to claim 7, wherein, in the forming of the alloy thin film, the tungsten-vanadium alloy thin film is formed in a predetermined composition ratio according to the heat treatment temperature.

9. The method according to claim 8, wherein, in the forming of the alloy thin film, when the heat treatment temperature is 250° C., the tungsten-vanadium alloy thin film having a composition ratio of vanadium (x) of 20 at %≤x≤90 at % is formed;

when the heat treatment temperature is 300° C., the tungsten-vanadium alloy thin film having a composition ratio of vanadium (x) of 0 at %<x≤70 at % is formed; and when the heat treatment temperature is 400° C., the tungsten-vanadium alloy thin film having a composition ratio of vanadium (x) of 0 at %<x≤30 at % is formed;

wherein "x" represents a real number.

* * * * *